United States Patent [19]
de Vries

[11] Patent Number: 5,495,168
[45] Date of Patent: Feb. 27, 1996

[54] METHOD OF SIGNAL ANALYSIS EMPLOYING HISTOGRAMS TO ESTABLISH STABLE, SCALED DISPLAYS IN OSCILLOSCOPES

[75] Inventor: Johan de Vries, Almelo, Netherlands

[73] Assignee: Fluke Corporation, Everett, Wash.

[21] Appl. No.: 304,909

[22] Filed: Sep. 12, 1994

[51] Int. Cl.⁶ .................................................. G01R 13/20
[52] U.S. Cl. ........................................ 324/121 R; 364/487
[58] Field of Search ............................... 324/121 R, 111, 324/76.13; 364/487

[56] References Cited

U.S. PATENT DOCUMENTS 4,743,844  5/1988  Odenheimer et al. ............... 324/121 R
5,003,248  3/1991  Johnson ................................ 324/121 R
5,343,405  8/1994  Kucera et al. ........................ 364/486

*Primary Examiner*—Ernest F. Karlsen
*Assistant Examiner*—Russell M. Kobert

[57] ABSTRACT

A method of signal analysis for establishing display scaling and stable triggering for digital oscilloscopes employs amplitude and time histograms to analyze an input signal and establish the required conditions. An amplitude histogram analysis method is first used to determine the minimum and maximum amplitude levels of the signal, and then a time histogram analysis method is used to determine the predominant time intervals occurring in the input signal. From these two analyses, vertical gain adjustments and time base settings adjustments may be made either manually or automatically, and triggering levels established to provide a stable, usable display.

5 Claims, 3 Drawing Sheets

METHOD OF SIGNAL ANALYSIS EMPLOYING HISTOGRAMS TO ESTABLISH STABLE, SCALED DISPLAYS IN OSCILLOSCOPES

BACKGROUND OF THE INVENTION

This invention relates generally to scaling and triggering arrangements for oscilloscopes, and in particular to a system for analyzing input signals using amplitude and time histograms to establish vertical sensitivity, time base setting, and triggering levels for oscilloscopes to provide stable, viewable displays.

Typical digital oscilloscopes rely on the user to manually adjust vertical and horizontal scale factors, and to adjust the triggering level to achieve stable triggering. More sophisticated oscilloscopes utilize digital comparators to detect peak amplitude values of input signals automatically to establish vertical sensitivity and level-crossing trigger detection automatically to establish a time base setting as well as a triggered display.

Achieving stable triggering has always been one of the more difficult tasks in operating an oscilloscope. In analog oscilloscopes, a trigger comparator issues trigger signals to start an associated time base sweep when an input signal matches a voltage level adjusted arbitrarily by a user, and often the precise triggering point is difficult to ascertain. In digital oscilloscopes, issuance of a valid trigger signal often is used to stop digital acquisition of an input signal in a so-called post-trigger mode, freezing the contents of an associated waveform memory so that a later reconstructed waveform display will show the user events leading up to the triggering event. Thus, establishing a set of conditions upon which a valid trigger will be issued can be complicated, even for experienced users. Accordingly, many attempts have been made to provide automatic triggering to relieve the user of this often frustrating task.

Many users are only interested in a stable image of an input signal to see whether or not something is wrong with the shape of the signal. For these users, operating the instrument is only a bothersome necessity. As oscilloscopes are being simplified and designed for use by lesser experienced personnel, a simple and inexpensive method of establishing automatic vertical sensitivity, time base setting, and triggering is desired.

SUMMARY OF THE INVENTION

In accordance with the present invention, a method of achieving automatic signal scaling and stable triggering for digital storage oscilloscopes employs amplitude and time histograms to analyze an incoming signal.

An untriggered, or free-running, incoming signal is converted to digital representations, or samples, by an analog-to-digital converter (ADC) in the conventional manner and processed by an acquisition processor. The digitized samples are first analyzed to form an amplitude histogram by counting the number of occurrences of each discrete amplitude value. The minimum (MIN) and maximum (MAX) signal excursions may be quickly determined by this method. The MIN and MAX amplitude values may then be used to adjust the vertical sensitivity of the input amplifier to result in an on-screen displayed waveform of an appropriately-scaled (on the vertical axis) reconstructed signal. Also, lower and upper triggering levels may be established within the peak-to-peak signal amplitude to permit level-crossing trigger signals to be generated by an associated trigger circuit.

Thereafter, the digitized samples are analyzed to form a time histogram by counting the number of samples that occur over each of a number of signal periods for cyclic waveforms such as sine or square waves, or intervals for complex waveforms, using level-crossing signal analysis to determine the signal intervals. That is, a signal interval (which for purposes of this discussion includes signal periods) is detected when the signal passes through a first level, then a second level, and then back to the first level, such as a low-high-low sequence or a high-low-high sequence. These occurrences are ordered in the form of lengths of intervals on a time histogram to determine which interval occurs most often. The interval thus determined as being the predominant interval of the input signal may then be used to adjust the horizontal time base to result in an on-screen displayed waveform of a predetermined or user-selected number of cycles of the signal.

It is therefore one feature of the present invention to use amplitude and time histograms in analyzing an input signal in a digital oscilloscope.

It is another feature of the present invention to provide an oscilloscope with display scaling and triggering information employing histograms to extract amplitude and time information from a waveform.

Other features, and advantages of the present invention will become obvious to those having ordinary skill in the art upon a reading of the following description when taken in conjunction with the accompanying drawings.

DETAILED DESCRIPTION OF THE INVENTION

Figure 1:
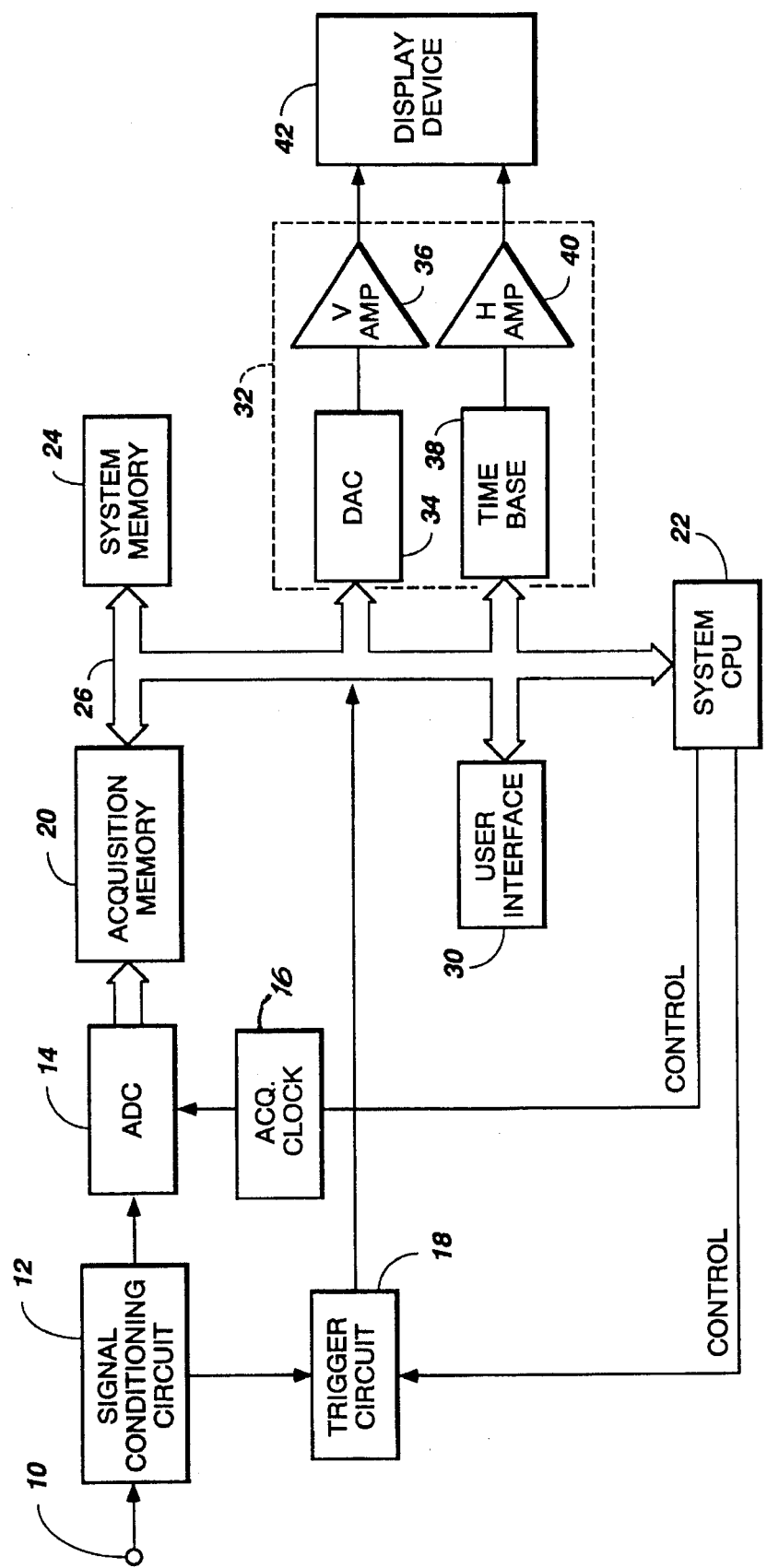
FIG. 1 is a generalized block diagram of a digital oscilloscope having a method of signal analysis employing histograms in accordance with the present invention.

Referring to FIG. 1 of the drawings, there is shown a generalized block diagram of a digital oscilloscope in which signal analysis in accordance with the present invention may be achieved. The circuitry is largely conventional, and therefore will be discussed in functional terms.

An input repetitive signal is applied via an input terminal 10 to a signal conditioning circuit 12. Signal conditioning circuit 12 may include conventional attenuators and gain-switching preamplifiers to adjust the input signal amplitude to a suitable level. The preamplified electrical signal is then applied to a track-and-hold/analog-to-digital converter (ADC) 14, which converts instantaneous values of the input signal to digitized samples at a rate determined by an acquisition clock 16. A replica of the input signal is applied from the signal conditioning circuit 12 to a trigger circuit 18, which issues a valid trigger signal upon the occurrence of a predetermined event (to be described later). The digitized samples produced by ADC 14 are continuously written into addresses in an acquisition memory 20 until acquisition is halted by a valid trigger event, freezing the memory contents. Thereafter, the digitized samples may be processed as digital data by a system microprocessor or CPU 22 and transferred to a system memory 24, from which such digital data may reconstructed for display.

CPU 22, which may suitably be a conventional microprocessor and its associated kernel devices, provides overall control of the oscilloscope system, and is connected via a CPU bus 26 to acquisition memory 20, system memory 24, a user interface 30 and a display unit 32. CPU 22 operates in accordance with its own stored program instructions and user-selected control information from the user interface 30, which may suitably include a conventional front-panel control system or a keyboard, as well as a microcontroller to scan and interpret the user selections and commands to provide the user-selected control information to CPU 22. Display unit 32 may include a digital-to-analog converter (DAC) 34, a vertical amplifier 36, a time base circuit 38, a horizontal amplifier 40, and a display device 42 for reconstructing and displaying acquired waveforms. These circuits are conventional and well known to those skilled in the art, and display device 42 may be any of a number of well-known available devices having a viewing screen suitable for displaying signal waveforms and textual information, such as a cathode-ray tube or a flat-panel liquid-crystal display.

CPU 22 analyzes the waveform from the digitized samples that are being written into the acquisition memory 20 and subsequently provides information for automatically scaling the waveform by adjusting the vertical sensitivity of amplifiers within signal conditioning circuit 12, and by adjusting the time base 38 to display a predetermined or user-selected number of cycles of waveform. Information is also provided to establish stable triggering. These functions will now be described in detail.

Figure 2A:
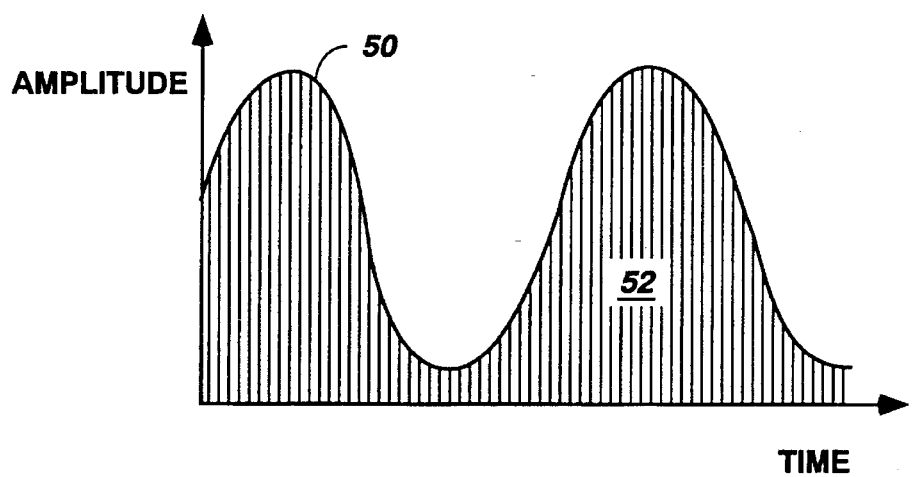
FIGS. 2A and 2B are respectively a repetitive waveform and its amplitude histogram.
Figure 2B:
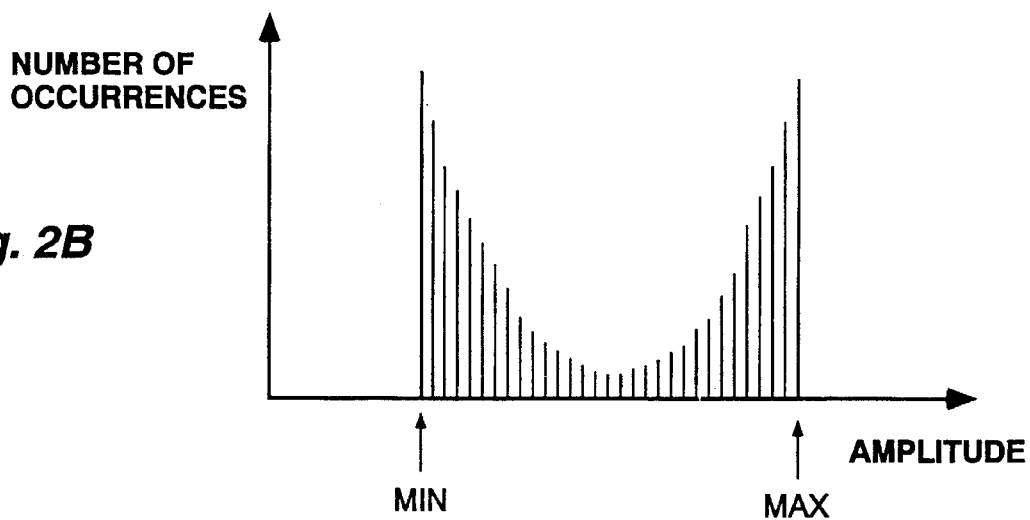

A stream of digitized samples from ADC 14 is continuously written into acquisition memory 20, as mentioned earlier. CPU 22 analyzes the samples to develop an amplitude histogram by counting the number of occurrences of each discrete amplitude value over some finite time interval, such as one trace, or display screen width of information. That is, suppose one trace is made up of 500 digitized samples. Each sample value is used as an index in the amplitude histogram. Refer to FIG. 2A which shows a representation of an analog waveform 50, which for purposes of discussion is a sine wave. Vertical lines 52 represent the discrete amplitude values of instantaneous samples taken along the time axis of the waveform. CPU 22 determines the number of times over one trace that each discrete amplitude value occurs, and internally constructs an amplitude histogram as shown in FIG. 2B.

From the amplitude histogram, the minimum (MIN) and maximum (MAX) amplitude values of the waveform are quickly discerned, and the two values are stored. The minimum and maximum amplitude values are used to determine whether or not attenuation or gain settings need to be adjusted, and the amount of adjustment needed. CPU 22 may then apply vertical sensitivity information, such as attenuation and vertical gain, to signal conditioning circuit 12 to appropriately scale the amplitude of the input signal to a viewable level on display device 42. Alternatively, the MIN and MAX values may be displayed to a user, who can then manually adjust the vertical sensitivity controls and settings from the front panel in the conventional manner. The histogram analysis and vertical gain adjustments may be repeated until optimal signal peak-to-peak amplitude (the distance between MIN and MAX in the histogram) is attained.

The minimum and maximum values are used to calculate two levels, e.g., at the 15% and 85% points, on the waveform for later use in making time histogram calculations and for establishing level-crossing trigger events to be generated by trigger circuit 18. The amplitude histogram form of analysis is based on statistics, and therefore it is necessary that the waveform traces being analyzed not be triggered during this time. Accordingly, trigger circuit 18 is disabled during the signal analysis.

Figure 3A:
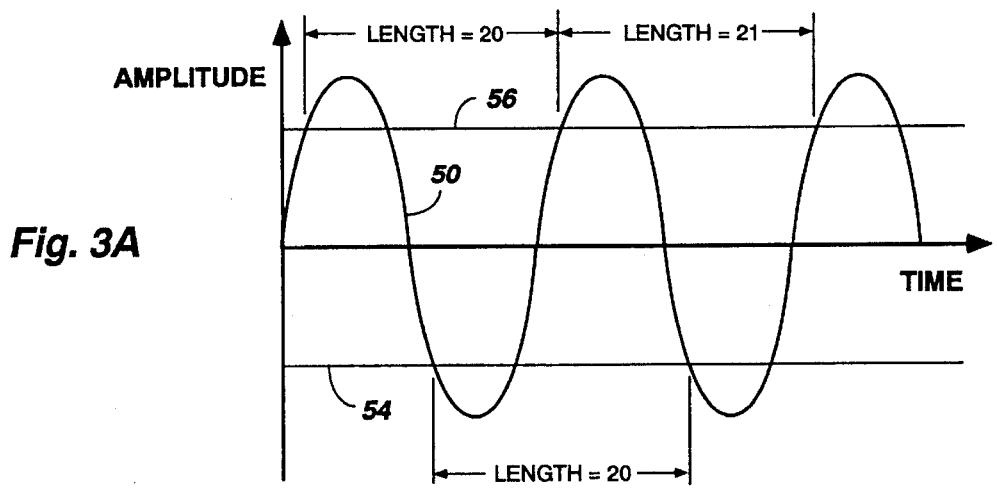
FIGS. 3A and 3B are respectively a cyclic waveform and its time histogram.
Figure 3B:
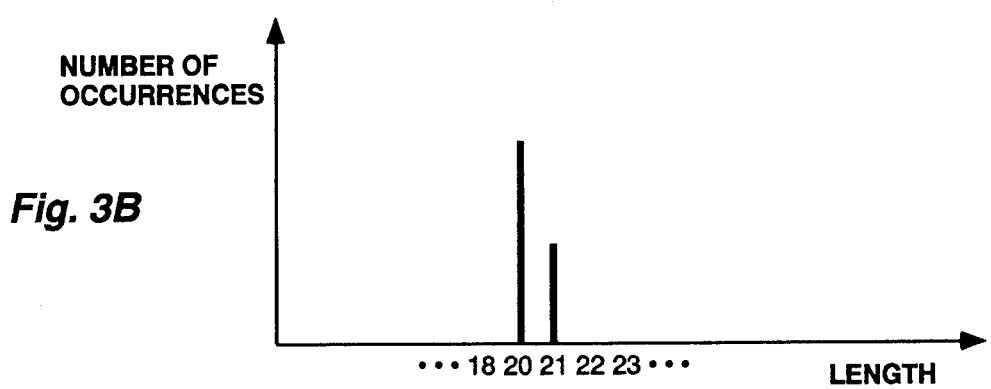

Next, CPU 22 analyzes the digital samples representing the input signal waveform to develop a time histogram by counting the number of samples that occur over each of a number of signal intervals, using level-crossing signal analysis to determine the signal intervals. With a time histogram, signal time intervals are used as the index. These time intervals are calculated in the following manner: Referring to FIG. 3A, the input signal is represented as a sine wave 50 with amplitude on the vertical axis, and time on the horizontal axis. The sine wave passes through two horizontal lines 54 and 56, which represent respectively the two aforementioned levels calculated at the 15% and 85% points between the minimum and maximum values. It should be pointed out that these percentages for the two levels 54 and 56 are not critical, and in fact may not yield satisfactory stable triggering. Therefore, other percentages, such as 25% and 75%, or 10% and 90%, may be utilized to improve performance. The time intervals are signal intervals or periods as measured beginning at both the low and high levels. The time is measured between a starting point at each level to an end point that is the same point on the waveform as the starting point to determine the time for one interval of signal. That is, a signal interval is detected when the signal passes through a first level, then a second level, and then back to the first level, such as a low-high-low sequence or a high-low-high sequence. For example, the length of each interval of signal in FIG. 3A is represented as being equal to either the number of samples taken over the measured interval, or by the number of clock cycles that occur over the measured interval, each of which can be converted to a time interval. These interval analyses are made for every interval starting at the low levels and at the high levels, and the number of occurrences of each time interval are assembled into a time histogram as shown in FIG. 3B. For example, in FIG. 3A a length of 20 samples occurred twice and a length of 21 samples occurred once, so in FIG. 3B, which depicts the number of occurrences on the vertical axis and length on the horizontal axis, a time histogram is constructed showing two occurrences at a length of 20 and one occurrence at a length of 21. The interval that occurs most often, a length of 20 in this case, is considered to represent the interval of the signal (calculated in the above example as 0.2 microseconds). Hence, if the signal is a sine wave, the frequency of the signal may be calculated as the reciprocal of the period (calculated in the above example as 5 megahertz).

The interval determined as being the predominant interval of the input signal may then be used to manually or automatically adjust the horizontal time base to result in an on-screen displayed waveform of a predetermined or user-selected number of cycles of the signal. Suppose, for example, that the user wishes to view two cycles of a 5-megahertz signal. Since each cycle of signal has a period of 0.2 microseconds, the length of displayed waveform over ten horizontal divisions will be adjusted to 0.4 microseconds, or 40 nanoseconds per division. The time base setting may therefore be quickly calculated and selected by the microprocessor or CPU 22, or may displayed to a user who can then manually adjust the time base controls.

CPU 22 determines either a low trigger level or a high trigger level from intervals which best match the signal period. The selected low or high trigger level is then applied to trigger circuit 12, and triggered operation is commenced. It should be noted that if neither the low level nor high level match a predominant signal interval, both a low and a high trigger level may be selected for use at the same time, providing a two-level triggering mode to obtain a stable display.

Figure 4A:
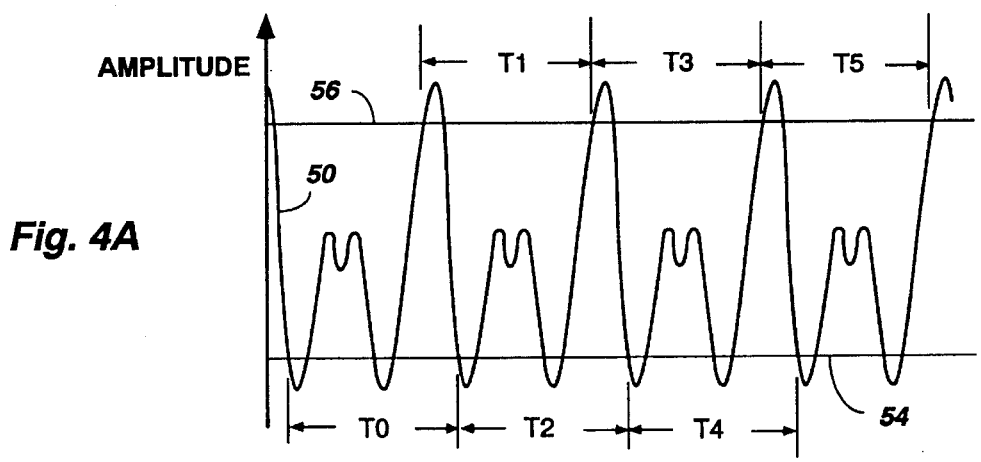
FIGS. 4A and 4B are respectively a complex waveform and its time histogram.
Figure 4B:
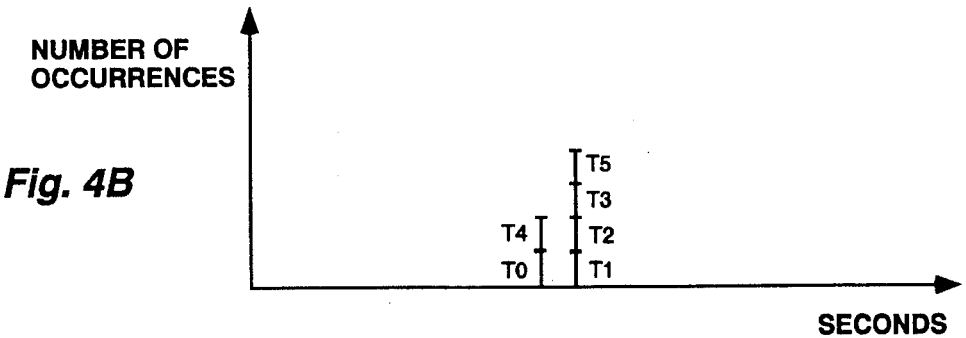

Another example of time histogram signal analysis is shown in FIGS. 4A and 4B. In FIG. 4A, a more complex waveform 50 is shown along with low and high levels 54, 56 determined from an amplitude histogram analysis. Here, the intervals T0, T2 and T4 are the low-high-low transition intervals, and the intervals T1, T3 and T5 are the high-low-high transition intervals. Let us suppose that intervals T0 and T4 are the same length, and T1, T2, T3, and T5 are the same length but slightly longer than T0 and T4. These occurrences are counted and assembled into the time histogram shown in FIG. 4B. As can be discerned from the time histogram, the interval represented by T1, T2, T3, and T5 is the predominant interval, and is used to determine the time base setting. Also, since this interval value recurs most often, level 56, in this instance, is selected as the trigger level and applied to trigger circuit 18.

Thus, it can be discerned than an amplitude histogram analysis is first used to determine minimum and maximum amplitude levels of the signal, and then a time histogram analysis is used to determine the period, or interval of the input signal. From these two analyses, vertical gain and time base adjustments or settings may be made either manually or automatically using conventional techniques, and a triggering level (or dual triggering level) established to provide a stable, usable display.

While I have shown and described the preferred embodiment of my invention, it will be obvious to those skilled in the art that many changes and modifications may be made without departing from my invention in its broader aspects. It is therefore contemplated that the appended claims will cover all such changes and modifications as fall within the true scope of the invention.

What I claim as my invention is:

1. A method of analyzing input signals to providing display scaling and triggering for a digital oscilloscope, comprising the steps of:
   (a) converting an input signal to digitized samples;
   (b) assembling the amplitude values of said digitized samples into an amplitude histogram determining therefrom the minimum and maximum amplitudes of said input signal;
   (c) establishing from said minimum and maximum amplitudes a low voltage level and a high voltage level intermediate said minimum and maximum amplitudes;
   (d) detecting time intervals occurring in said input signal and assembling detected time intervals in a time histogram to determine a predominant time interval, wherein each detected time interval is the time for the input signal to pass through a first amplitude level, then a second amplitude level, and then back to the first amplitude level, said first amplitude level comprising one of said low voltage level and said high voltage level, and said second amplitude level comprising the other of said low voltage level and said high voltage level; and
   (e) selecting at least one of said low voltage level and said high voltage level as a trigger level.

2. A method in accordance with claim 1 wherein said minimum and maximum amplitudes determined by said amplitude histogram are utilized to adjust vertical scaling of said digital oscilloscope.

3. A method in accordance with claim 1 wherein said predominant interval of said input signal determined from said time histogram is utilized to adjust a time base setting of said digital oscilloscope.

4. A method in accordance with claim 1 wherein step (d) includes detecting time intervals starting on both of said low voltage level and said high voltage level using a time histogram to determine a predominant interval of said input signal.

5. A method in accordance with claim 4 wherein step (e) includes selecting both of said low voltage level and said high voltage level as trigger levels to provide dual-level triggering.

* * * * *